United States Patent [19]

Suganuma

[11] Patent Number: 4,554,452
[45] Date of Patent: Nov. 19, 1985

[54] METHOD AND APPARATUS FOR HANDLING CHARGED PARTICLE BEAM

[75] Inventor: Tadao Suganuma, Hachiouji, Japan

[73] Assignee: Elionix, Inc., Hachiouji, Japan

[21] Appl. No.: 514,632

[22] Filed: Jul. 18, 1983

[30] Foreign Application Priority Data

Jul. 22, 1982 [JP] Japan .................... 57-128136

[51] Int. Cl.⁴ .................... G01N 23/00
[52] U.S. Cl. .................... 250/310; 250/311
[58] Field of Search .......... 250/307, 310, 311, 396 R, 250/396 ML

[56] References Cited

U.S. PATENT DOCUMENTS

| | | | |
|---|---|---|---|
| 3,748,467 | 7/1973 | Suganuma | 250/311 |
| 3,937,959 | 2/1976 | Namae | 250/311 |
| 4,214,163 | 7/1980 | Namae et al. | 250/311 |

Primary Examiner—Bruce C. Anderson
Assistant Examiner—Paul A. Guss
Attorney, Agent, or Firm—Bucknam and Archer

[57] ABSTRACT

In a method of and an apparatus for handling a charged particle beam, at least one of a signal representative of the astigmatism and a signal for correction of the astigmatism is obtained by computation on the basis of values detected under a certain condition from signal particles derived from an object which is moved repeatedly at least two directions with respect to a charged particle beam. The amount and direction of astigmatism thus computed are displayed respectively for manual correction. Astigmatism correction and focusing can be also carried out automatically.

6 Claims, 5 Drawing Figures

METHOD AND APPARATUS FOR HANDLING CHARGED PARTICLE BEAM

BACKGROUND OF THE INVENTION

1. Field of the Invention

The present invention relates to an apparatus and method for handling a charged particle beam in a scanning electron microscope, X-ray microanalyzer, electron beam exposure system or the like.

2. Prior Art

In a charged particle-beam handling apparatus employed in a scanning electron microscope or electron beam exposure system, it is of great importance to correct the astigmatism of a charged particle beam on a sample or object for enhancing the precision and resolution thereof.

It has been customary heretofore for the user to make the necessary correction of the astigmatism through his own visual judgment of the quality of an image on the screen of a cathode ray tube.

It however requires a high degree of skill and a considerably long time for the user to make himself acquainted with such a process of correction, as he must simultaneously adjust both the direction and amount of the astigmatism by means of astigmatic correction devices relying solely on his visual sense in a trial-and-error mode. This imposes a heavy burden on the user.

These difficulties arise out of the fact that the direction and amount of the astigmatism are quantitatively unknown. If these parameters were quantitatively measurable, it would become possible to make correct adjustment of the correction device in accordance with the values measured.

SUMMARY OF THE INVENTION

It is therefore an object of the present invention to provide an apparatus and method for handling a charged particle beam whereby astigmatism can be measured quantitatively, thus enabling even a non-skilled user to adjust the astigmatism correction device and obtain a correct focus with a high degree of accuracy, quickly and with the utmost ease.

Another object of the present invention is to provide an apparatus for automatic correction of astigmatism.

According to the present invention, there is provided an apparatus and method for handling a charged particle beam whereby the focus of a charged particle beam on an object is varied with a relative movement thereof repeated in at least two directions, thereby obtaining signal particles from the object, whereby the focal point, or the condition for minimizing the cross-sectional component of the charged particle beam in the direction of its movement on the object, is detected using the wave form of the signal particles with respect to the individual directions of the movements, and wereby a computation based on the detected values is used to obtain at least one of a signal representative of the astigmatism, a signal for correction of the astigmatism and a signal for exact focusing. Thus, it becomes possible to make a quantitative measurement of astigmatism so as to enable automatic correction of astigmatism and image focusing.

Many other advantages, features and additional objects of the present invention will become manifest to those versed in the art upon referring to the detailed description and the accompanying drawings in which preferred structural embodiments, incorporating the principles of the present invention, are shown by way of illustrative example.

DETAILED DESCRIPTION

Figure 1:
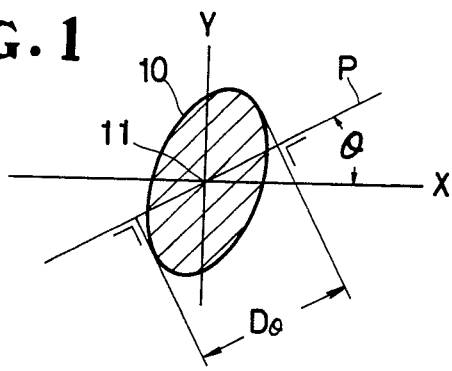
FIG. 1 is a cross-sectional view of a charged particle beam in the presence of an astigmatism, the view illustrating the principle of the present invention.
Figure 2:
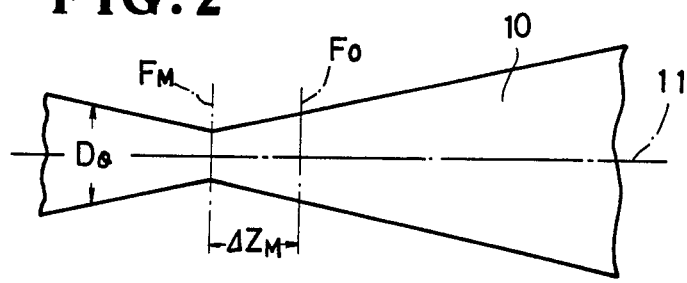
FIGS. 2 and 3 are longitudinal views of the charged particle beams, illustrating the principle of the present invention.

In FIG. 1, a charged particle beam 10 and a beam axis 11 are shown in the presence of an astigmatism wherein the beam 10 is elliptical. $D\theta$ denotes a component of the charged particle beam 10 projected onto a plane P which is inclined at an angle $\theta$ to the X-axis of X-Y coordinates whose origins (0, 0) are on the beam axis 11; FIG. 2 shows a distribution of the beam component $D\theta$ along the beam axis 11; and FIG. 3 also shows a distribution of $D\theta$ along the axis 11, but at a different angle $\theta$. When the beam 10 in FIG. 1 is scanned on an object in the direction $\theta$, the diameter of the beam is substantially considered to be $D\theta$.

The astigmatism of the charged particle beam $\Delta U$ is generally expressed as $$\Delta U = \Delta Z \omega e^{i\chi} + N_L \omega e^{-i(\chi - 2\lambda_L)} \quad (1)$$

where $\Delta Z$ denotes position along the beam axis 11; $\omega$ is an angle of cone of the beam; e is the base of natural logarithms; $i = \sqrt{-1}$; $\chi$ is phase of the beam; $N_L$ is the amount of the astigmatism; and $\lambda_L$ is the direction of the astigmatism. The astigmatism is correctable when its amount $N_L$ and direction $\lambda_L$ are known in Eq. (1).

Figure 3:
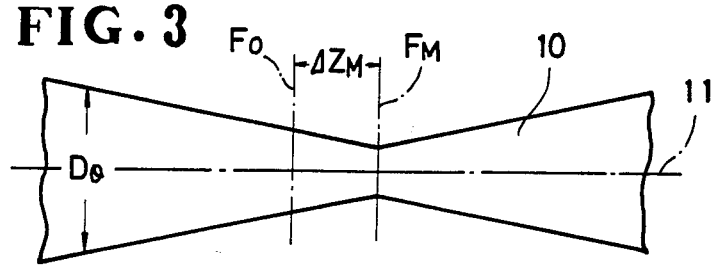

Considering now the shape of the beam in the cases where the angle $\theta$ takes two different values, there exists in each case a postion $F_M$ at which the width $D\theta$ becomes minimal, as is obvious from FIGS. 2 and 3. When no astigmatism is present, the position $F_M$ remains unchanged with respect to any value of $\theta$ and is then coincident with the focal plane Fo. However, in the presence of any astigmatism, the position $F_M$ is displaced from the focal plane Fo and varies depending on the value of $\theta$ as illustrated in FIGS. 2 and 3. The distance $\Delta Z_M$ between the position $F_M$ and the focal plane Fo can be obtained by first finding from Eq. (1) the length $D\theta$ of projection of the astigmatism $\Delta U$ onto the plane P and then calculating the distance $\Delta Z$ at which the width $D\theta$ becomes minimal. The result is as follows.

$$\Delta Z_M = -N_L \cdot \cos\{2(\lambda_L - \theta)\} \quad (2)$$

where $\theta$ takes a value of $\theta 1$, the distance $\Delta Z_M$ is obtained by substituting $\theta 1$ for $\theta$ in Eq. (2).

The position $F_M$ can also be determined when the angle $\theta$ is changed to $\theta 2, \theta 3 \ldots \theta n$, and the distance $\Delta Z$ in each of such cases can similarly be represented by Eq. (2).

If the lens consists of an electromagnetic coil, a relationship, Eq. (3), exists between the exciting current Io flowing when the focal point is coincident with the focal plane Fo, the exciting current I flowing when the focal point is slightly displaced to coincide with the position $F_M$, and the difference $\Delta I$ between the exciting currents Io and I. Eq. (4) is valid where the current difference $\Delta I$ is relatively small. Thus, $$I = Io + \Delta I \quad (3)$$

and $$\Delta Z_M = K_L \cdot \Delta I \quad (4)$$

where $K_L$ denotes a constant determined by the lens. Consequently, the following equation is derived from Eqs. (2), (3) and (4).

$$K_L(I - Io) = -N_L \cdot \cos\{2(\lambda_L - \theta)\} \quad (5)$$

When the values of I, measured at three different angles are substituted for I in Eq. (5), we obtain three simultaneous equations, from which three unknowns, the amount $N_L$, the direction $\lambda_L$, and the current Io can be found.

Supposing now that the measured values of the exciting current I are I1, I2 and I3 corresponding respectively to $\theta$ equal to 0, $\pi/4$ and $\pi/2$, the calculations are as follows.

Firstly, substituting the values stated above for I and $\theta$ in Eq. 5, $$K_L(I1 - Io) = -N_L \cdot \cos\{2(\lambda_L - 0)\} \quad (6)$$

$$K_L(I2 - Io) = -N_L \cdot \cos\{2(\lambda_L - \lambda/4)\} \quad (7)$$

$$K_L(I3 - Io) = -N_L \cdot \cos\{2(\lambda_L - \pi/2)\} \quad \ldots (8)$$

From the above, $N_L$ and $\lambda_L$ are given by $$N_L = \frac{K_L}{\sqrt{2}} \sqrt{(I3 - I2)^2 + (I2 - I1)^2} \quad (9)$$

$$\lambda_L = \tfrac{1}{2}\tan^{-1} \frac{(I3 - I2) - (I2 - I1)}{(I3 - I2) + (I2 - I1)} \quad (10)$$

Since $K_L$ is a constant inherent in the apparatus of which the value can be measured, $N_L$ and $\lambda_L$ can be found from Eqs. (9) and (10) by measuring the currents I1, I2 and I3, hence achieving quantitative measurement of the astigmatism.

With the amount $N_L$ and the direction $\lambda_L$ of the astigmatism found in the manner described above, the desired correction can be made by introducing, through astigmatic correction coils, a corrective astigmatism which is equal in amount to the said astigmatism generated by the focusing lens and which has a directional difference of 90° therefrom. Therefore, the corrective amount Ns and the corrective direction $\lambda s$ are given by $$Ns = N_L \quad (11)$$

$$\lambda_s = \lambda_L + \pi/2 - \phi s \quad (12)$$

where $\lambda_s$ denotes the direction of the correcting coil and has a known value. Accordingly, substituting Eqs. (9) and (10) for Eqs. (11) and (12), $$Ns = \frac{K_L}{\sqrt{2}} \sqrt{(I3 - I2)^2 + (I2 - I1)^2} \quad (13)$$

-continued $$\lambda s = \tfrac{1}{2}\tan^{-1} \frac{(I3 - I2) - (I2 - I1)}{(I3 - I2) + (I2 - I1)} + \frac{\pi}{2} - \phi s \quad (14)$$

Thus, it becomes possible accurately to determine the corrective amount and direction of the astigmatism by measuring the values of I1, I2 and I3.

Further from Eqs. (6) and (8), the following is obtainable.

$$Io = \frac{I1 + I3}{2} \quad (15)$$

In the above, Io is the exciting current flowing in the lens when the focal point coincides with the focal plane Fo. Therefore, with the values of I1, I2 and I3 measured, the astigmatism of the charged particle beam can be corrected according to Eqs. (13) and (14) while exact focusing is simultaneously executed according to Eq. (15).

It is possible to find the value of Io by another method as well. When there exists any astigmatism, sharpness of the image deteriorates in a direction corresponding to the longer axis of the elliptical beam, both in an under-focused or over-focused plane. The best focus plane Fo is between these, wherein the sharpness of the image is isotropic. Therefore, Io can be obtained by setting the image in such an isotropic state and measuring the exciting current I flowing at that moment. Subsequently, when the values of I measured at two different values of $\theta$ are substituted in Eq. (5), two simultaneous equations result where Io is known and only $N_L$ and $\lambda_L$ are unknown, thereby facilitating the calculation. Although this method requires subjective judgment of the image, it is relatively easy to judge the state of image with isotropic sharpness, so that the advantage of requiring only two different values of $\theta$ is still maintained.

In addition to the foregoing case where correction of the astigmatism is executed by a polar coordinate system to control the corrective amount and direction, similar correction is also achievable by a rectangular coordinate system which directly controls the currents Isx and Isy supplied to the correcting coils.

By converting the polar coordinates Ns and $\lambda s$ in Eqs. (13) and (14) to rectangular coordinates, the following equations are obtained $$Isx = \tfrac{1}{2} \cdot \frac{K_L}{K_S} [\{(I3 - I2) - (I2 - I1)\} \cdot \cos 2\phi s - \quad (16)$$

$$\{(I3 - I2) + (I2 - I1)\} \cdot \sin 2\phi s]$$

$$Isy = \tfrac{1}{2} \cdot \frac{K_L}{K_S} [\{(I3 - I2) - (I2 - I1)\} \cdot \sin 2\phi s + \quad (17)$$

$$\{(I3 - I2) + (I2 - I1)\} \cdot \cos 2\phi s]$$

where Ks is a constant determined by the shape and the number of turns of the correcting coils, and its value is previously known. Consequently, as is obvious from Eqs. (16) and (17), both Isx and Isy can be found by measuring I1, I2 and I3, hence attaining proper correction.

Even when the angle $\theta$ is changed to values other than the foregoing, or to four or more different values to convert Eq. (5) into simultaneous equations, it is still possible to find the amount $N_L$ and the direction $\lambda_L$ of the astigmatism in the same manner as in the foregoing.

The present invention has been accomplished in view of the points mentioned above. In an apparatus and method for handling a charged particle beam according to the present invention, the focus of the charged particle beam on an object is varied by moving it in at least two directions. The focal point, or the condition for minimizing the cross-sectional component of the charged particle beam in the direction of its movement on the object, is detected using the wave form of the signal particles derived from the object with respect to the individual directions of the movement. And, computation is made on the basis of the values thus detected to obtain at least one of a signal representative of the astigmatism and a signal for correction of the astigmatism.

The relative movement of the sample and the charged particle beam within a plane transverse to the beam axis is caused generally by deflecting the particle beam to perform electrostatic or electro-magnetic scanning. However, the same effect is attainable also by moving the object itself in a direction to traverse the particle beam which is held stationary.

The focus of the charged particle beam on the object may be varied by adjusting the focusing lens excitation or by displacing the object along the beam axis.

The signal particles may be those reflected from the object, secondary charged particles derived from the object, those having permeated through the object, those absorbed in the object, or non-charged particles such as X-ray photons excited in the object. In the waveform of the signal produced by detecting the signal particles simultaneously with the relative movement of the object and the charged particle beam, the rise of the waveform represents the cross-sectional component of the charged particle beam in the direction of its movement. Therefore, when the said rise becomes sharpest, it corresponds to the moment the cross-sectional component of the beam in the direction of its movement on the object is minimized.

The focus adjusting condition that minimizes the cross-sectional beam component in the direction of its movement on the object may be detected in the form of a current value or a voltage of the focusing lens excitation at the time of minimization or in the form of a position of the object along the axis of the beam.

The present invention will be described hereinafter with reference to FIGS. 4 and 5.

Figure 4:
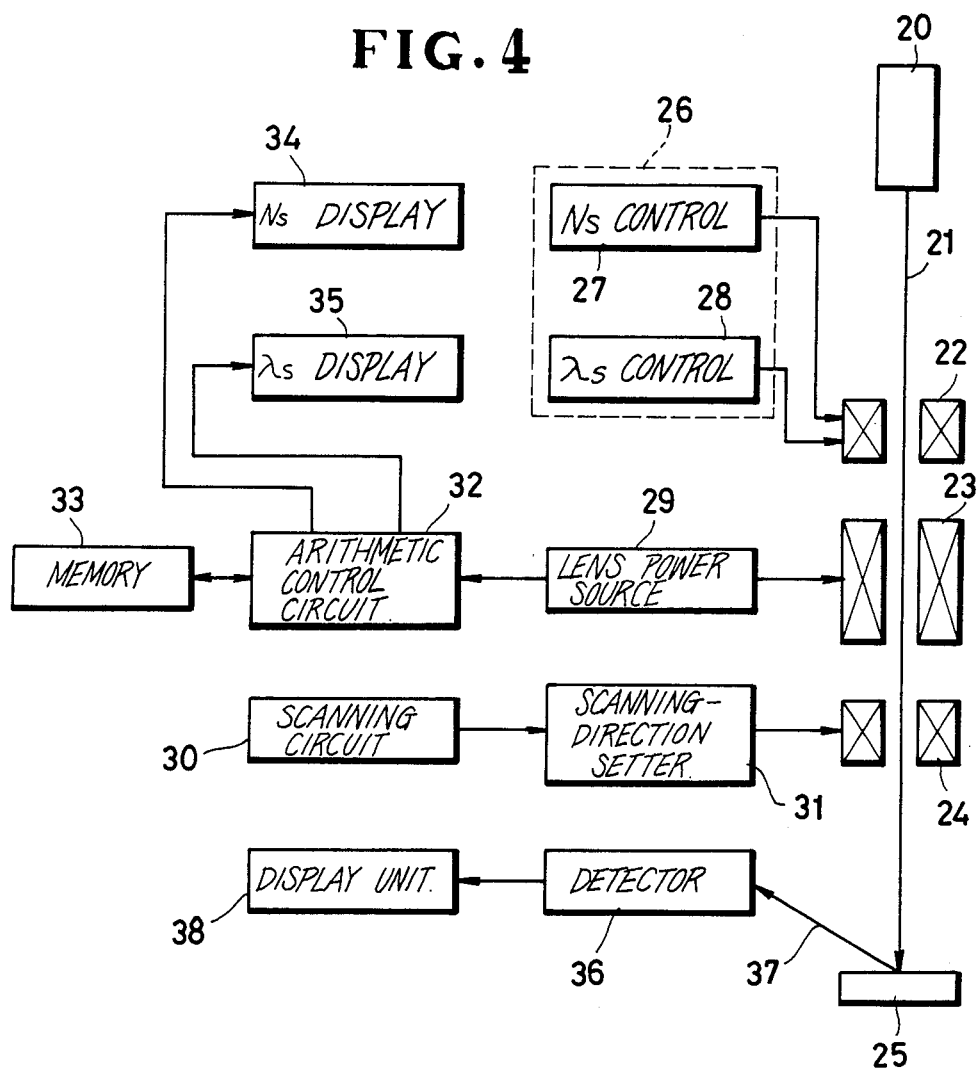
FIG. 4 is a schematic block diagram of an apparatus according to one embodiment of the present invention.

FIG. 4 is a block diagram of a representative charged particle-beam handling apparatus equipped with an astigmatic correction indicator or display and a manual astigmatism corrector. The apparatus comprises a beam generator or source 20 for emitting a charged particle beam 21 which is directed via an astigmatism correcting coil 22, a focusing lens 23 and a scanning coil 24, in that order and which then irradiates an object 25.

The correcting coil 22 is furnished with currents from an astigmatism correction unit 26 which consists of an Ns control 27 for controlling the amount Ns of the astigmatism correction and a λs control 28 for controlling the direction λs of the astigmatism correction. Each of the controls 27, 28 is so arranged as to control the current by manually adjusting a variable resistor (not shown).

The focusing lens 23 is excited by the current supplied from a lens power source 29, while the scanning coil 24 is excited by the current inputted from a scanning circuit 30 via a scanning-direction setter 31, thereby deflecting the charged particle beam in a scanning manner within a plane transverse to the axis of the charged particle beam 21. The lens power source 29 is so formed as to control the exciting current I by means of a variable resistor (not shown). The scanning-direction setter 31 is equipped with a switch (not shown) for selectively setting the scanning angle of the beam to 0, $\pi/4$ and $\pi/2$.

A central processing unit or an arithmetic control circuit 32 is connected to the lens power source 29 for detecting the exciting current I1, I2 and I3 supplied from the lens power source 29 to the focusing lens 23, then storing the detected values in a memory 33 and computing Eqs. (13) and (14) on the basis of the current values stored. Connected to the arithmetic control circuit 32 are an Ns display 34 for indicating the calculated amount Ns of the astigmatism and a λs display 35 for indicating the calculated direction λs of the astigmatism. The apparatus further includes a detector 36 for detecting signal particles 37 such as secondary electrons or reflected electrons from the object 25. A display unit 38 is connected to the detector 36 for displaying a line profile obtained by the output signal of the detector 36 while the charged particle beam 21 is scanned on the object.

In the apparatus thus arranged, correction of the astigmatism is effected by:

[1] switching off the controls 27, 28;

[2] operating the switch of the scanning direction setter 31 to set the scanning direction or the angle $\theta$ to 0, subsequently causing the charged particle beam 21 to scan the object 25 repeatedly, then establishing a proper exciting current in the lens power source 29 by means of the variable resister in such a manner that the line profile displayed on the display unit 38 has the sharpest rise, and storing the current value I at that moment as I1 in the memory 33;

[3] finding the value of I2 after setting the angle $\theta$ to $\pi/4$ in the same manner as in [2], and subsequently also finding the value of I3 after setting the angle $\theta$ to $\pi/2$, and storing in the memory 33 the current values thus obtained;

[4] computing Eqs. (13) and (14) in the arithmetic control circuit 32 on the basis of the current values I1, I2 and I3 stored in the memory 33;

[5] displaying the calculated Ns and λs on the displays 34, 35 respectively; and

[6] switching on the control power sources 27, 28, and manually adjusting the same in accordance with the indicated values of Ns and λs respectively, thereby achieving proper correction of the astigmatism.

In case the requirement is merely to find the amount and the direction of the astigmatism of the charged particle beam without necessity of correcting the astigmatism, the results of computing Eqs. (9) and (10) may be shown on the displays 34, 35.

Figure 5:
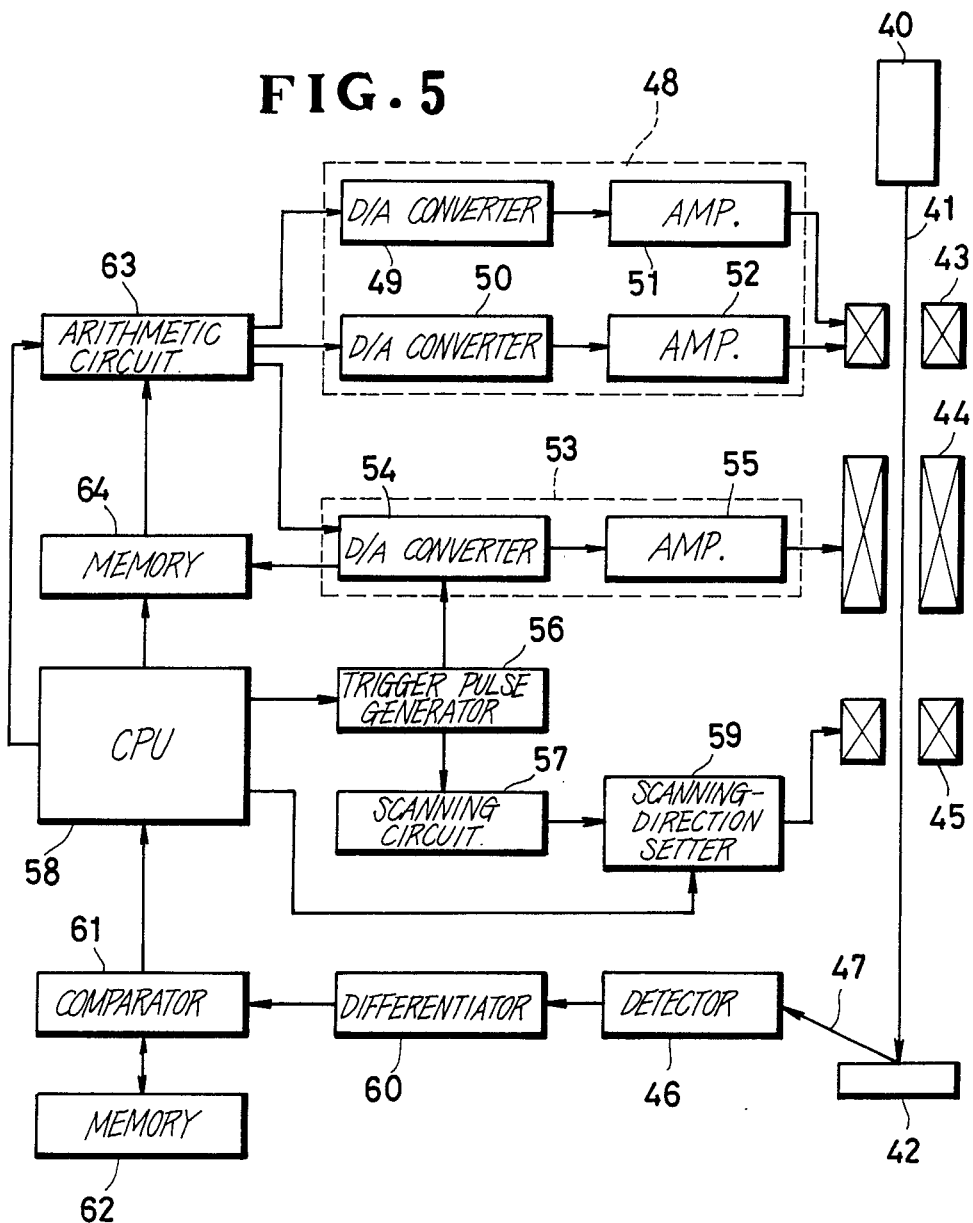
FIG. 5 is a diagram similar to FIG. 4, showing another embodiment of the present invention.

An apparatus according to another embodiment of the invention is shown in FIG. 5 and equipped with an automatic astigmatism correcting device and an automatic focusing device.

The apparatus comprises a beam source 40 for directing a charged particle beam 41 to an object 42, an astigmatism correcting coil 43, a focusing lens 44, a scanning coil 45 and a detector 46 for detecting signal particles 47 derived from the object 42, all the components 40–47 corresponding to 20–25, 36 and 37 of the apparatus shown in FIG. 4. The apparatus further includes an astigmatism correction power unit 48 having two control power sources for supplying an exciting current to the astigmatism correcting coil 43. The power sources consist of pairs of D/A converters 49, 50 and amplifiers 51, 52. The D/A converter 49 and amplifier 51 together serve to correct the amount Ns of the astigmatism, while the D/A converter 50 and the amplifier 52 together serve to correct the direction of λs of the astigmatism. A lens power source 53 consists of a D/A converter 54 and an amplifier 55 which are connected in series to the focusing lens 44 to vary the focus of the charged particle beam 41 and finally to produce a focusing current Io as an output. A trigger pulse generator 56 feeds a trigger pulse to both the D/A converter 54 and a scanning circuit 57 upon arrival of a start instruction from a central processing unit 58. The scanning circuit 57 feeds a scanning signal to the scanning coil 45 via a scanning-direction setter 59. A differentiator 60 differentiates the output of the detector and a comparator 61 compares the peak value of the differential waveform fed from the differentiator 60 with the peak value stored in a memory 62. An arithmetic circuit 63 is connected to all the D/A converters 49, 50, 54, and upon instruction from the unit 58, feeds them the result Ns, λs and Io of the calculations executed therein, respectively. A memory 64 is connected to the D/A converter 54 for storing the output therefrom.

The operation of the above apparatus is as follows.

[1] When a start button (not shown) is depressed to feed an operation start command to the central processing unit 58, the unit 58 resets both the arithmetic circuit 63 and the scanning-direction setter 59, whereby the output of the astigmatism correction power circuit 48 is reduced to zero and the scanning direction is set at $\theta=0$. The central processing unit 58 sends a start instruction to the trigger pulse generator 56, which then feeds a trigger pulse to both the D/A coverter 54 and the scanning circuit 57, thereby setting the D/A converter 54 at a certain value. The output voltage of the D/A converter 54 is converted into an exciting current by the amplifier 55 and then is applied to the focusing lens 44. Simultaneously, upon arrival of the trigger pulse, the scanning circuit 57 sends a scanning signal, via the direction setter 59 to the scanning coil 45, which causes the charged particle beam 41 to scan the object 42 once.

[2] Signal particles derived from the object 42, scanned by the charged particle beam 41, are detected by the detector, whose output signal is differentiated by the differentiator 60 and then is fed to the comparator 61 where the peak value of the differential waveform is compared with the peak value stored previously in the memory 61. When the peak value previously stored is smaller, it is erased and instead a new value obtained from the differentiator 60 is stored.

[3] Upon completion of one scanning cycle, the central processing unit 58 sends a start instruction again to the trigger pulse generator 56, which then feeds the next trigger pulse to both the D/A converter 54 and the scanning circuit 57.

[4] Subsequently the D/A converter 54 generates a voltage level with one incremental step, whereby an exciting current having one incremental step is applied to the focusing lens 44 to vary the focus of the charged particle beam 41. In response to the trigger pulse received, the scanning circuit 57 produces an output signal of one scanning cycle again.

[5] The differentiator 60, comparator 61 and memory 62 perform the operations of item [2] above.

[6] Thereafter the operations of items [3], [4] and [5] above are repeated until the peak value of the output signal of the differentiator 60 is determine to be maximum in the comparator 61. The decision in the comparator 61 can be effected by detecting that, for example, the peak value of the output signal of the differentiator 60 has become equal to the peak value in the preceding scanning cycle (meaning a state without any variation in the peak value). [7] When the peak value of the output signal of the differentiator 60 reaches its maximum, the comparator 61 sends to the central procssing unit 58 a pulse signal representing such a state which simultaneously clears the memory 62, whereby the central processing unit 58 ceases sending a start instruction.

[8] The time the output signal of the differentiator 60 is maximal in item [7] corresponds to the time when the output waveform of the detector 46 has the sharpest rise. Since the width $D\theta$ (the component of the beam in the scanning direction $\theta$) is minimal at this moment, the central processing unit 58 causes the memory 64 to store therein the output value of the D/A converter 54 as I1 in Eqs. (13), (14) and (15).

[9] In a similar manner, I2 and I3 are obtained by setting the scanning direction to $\pi/4$ and $\pi/2$, respectively.

[10] When I1, I2 and I3 are thus obtained, the central processing unit 58 sends a calculation command to the arithmetic circuit 63, which thereby computes Eqs. (13), (14) and (15) on the bases of I1, I2 and I3 stored in the memory 64 and calculates the amount Ns and the direction λs of a required corrective astigmatism and also the focusing current Io. Subsequently, the arithmetic circuit 63 feeds Ns, λs and Io to the converters 49, 50 and 54 respectively, so that Ns and λs are fed via the amplifiers 51, 52 to the correcting coil 43 to correct the astigmatism properly. Meanwhile, Io is fed via the amplifier 55 to the focusing lens 44 to attain exact focusing. In case the correcting device is of the type employing a rectangular coordinate system, computation of Eqs. (16) and (17) may be executed by the arithmetic circuit 63.

In addition to the foregoing embodiments where focusing and deflection of the charged particle beam 41 and correction of its astigmatism are effected electromagnetically under control of the current, an electrostatic type control using an electrode may also be adapted to perform the necessary control by varying the voltage applied.

With the arrangement of the present invention, the focus of a charged particle beam on an object is varied with a relative movement thereof repeated in at least two directions, and the focal point or the condition for minimizing the cross-sectional component of the charged particle beam in the direction of its movement on the object is detected using the waveform of the signal particles from the object with respect to the individual directions of the movements, and computation is made on the basis of the detected focus values to obtain at least one of a signal representative of the astigmatism, a signal for correction of the astigmatism and a signal for exact focusing. Thus, it becomes possible to realize quantitative measurement of the astigmatism as well as to devise a system to perform automatic correction and focusing. Thus, according to the first embodiment of the invention, merely the lens power source needs to be adjusted in such a manner that the line profile on the display unit has the sharpest rise, so that quantitative measurement of the astigmatism is rendered possible to eventually allow even a non-skilled user to achieve accurate correction easily in a short period of time. Furthermore, according to the second embodiment, astigmatic correction and focusing can be carried out automatically, the user has only to depress the start button. There is no need for subjectial judgment at all, thus ensuring fast and precise handling of the charged particle beam.

Although various minor modifications may be suggested by those versed in the art, it should be understood that I wish to embody within the scope of the patent based hereon, all such embodiments as reasonably and properly come within the scope of my contribution to the art.

I claim as my invention:

1. A method for handling a charged particle beam, comprising the steps of:
    (a) effecting a relative movement of an object and the charged particle beam repeatedly in at least three directions within a plane transverse to the axis of the charged particle beam;
    (b) adjusting the focus of the charged particle beam on the object to obtain signal particles derived from the object;
    (c) detecting, on the basis of said signal particles, the focus adjusting values that minimize the cross-sectional component of the charged particle beam in the individual direction of the movement thereof on the object; and
    (d) computing, on the basis of the differences between the said values thus detected, at least one of a signal representing the astigmatism of the charged particle beam and a signal for correction of the astigmatism.

2. An apparatus for handling a charged particle beam, comprising:
    (a) means for effecting a relative movement of the charged particle beam and an object repeatedly within a plane transverse to the axis of the charged particle beam;
    (b) means for switching said movement to at least three directions;
    (c) means for adjusting the focus of the charged particle beam on the object;
    (d) a detector for detecting signal particles derived from the object;
    (e) a device for displaying the sharpness of the waveform of the signal detected; and
    (f) means for (1) storing, with regard to the individual directions of said movement, the condition of said focus adjusting means at the time of minimizing the cross-sectional component of the charged particle beam in the direction of the movement thereof of the object, and (2) computing, on the basis of the differences between the stored contents, at least one of a signal representing the astigmatism of the charged particle beam and a signal for correction of the astigmatism.

3. An apparatus for handling a charged particle beam, comprising:
    (a) means for effecting a relative movement of the charged particle beam and an object repeatedly within a plane transverse to the axis of the charged particle beam;
    (b) means for switching said movement to at least three directions;
    (c) means for adjusting the focus of the charged particle beam on the object;
    (d) a detector for detecting signal particles derived from the object; and
    (e) means for (1) comparatively judging, from the waveform of the signal detected, the amount of the cross-sectional component of the charged particle beam in the direction of movement thereof on the object, then (2) storing, with regard to the individual directions of said movement, the condition of said focus adjusting means at the time of minimizing said beam component in the direction of the movement thereof on the object, and (3) computing, by the use of the differences between the stored contents, at least one of a signal representing the astigmatism of the charged particle beam and a signal for correction of the astigmatism.

4. A method as in claim 1, further comprising the step of:
    (a) correcting the astigmatism of the charged particle beam by introduction of said signal for correction of the astigmatism.

5. An apparatus according to claim 3 in which said comparatively judging, storing and computing means further comprises a digital computer programmed to carry out said comparatively judging, storing and computing operations.

6. An apparatus according to claim 5, further comprising means for converting said computed signal representing the astigmatism of the charged particle beam, and said signal for correction of the astigmatism, into electrical signals adapted for automatic correction of the astigmatism of the particle beam.

* * * * *